(12) United States Patent
Nodono et al.

(10) Patent No.: US 10,399,310 B2
(45) Date of Patent: Sep. 3, 2019

(54) RESIN FILM, LAMINATE, OPTICAL MEMBER, GAS BARRIER MATERIAL AND TOUCH SENSOR SUBSTRATE

(71) Applicants: SUMITOMO CHEMICAL COMPANY, LIMITED, Tokyo (JP); INDUSTRIAL TECHNOLOGY RESEARCH INSTITUTE, Hsinchu (TW)

(72) Inventors: Mitsunori Nodono, Tsukuba (JP); Takashi Sakurai, Tsukuba (JP); Katsunori Mochizuki, Osaka (JP); Junichi Ikeuchi, Tsukuba (JP); Boram Pyeon, Tsukuba (JP); Tzong Ming Lee, Chutung Hsinchu (TW); Chyi Ming Leu, Chutung Hsinchu (TW); Chih Cheng Lin, Chutung Hsinchu (TW)

(73) Assignees: SUMITOMO CHEMICAL COMPANY, LIMITED, Tokyo (JP); INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 47 days.

(21) Appl. No.: 15/741,400

(22) PCT Filed: Jul. 21, 2016

(86) PCT No.: PCT/JP2016/071454
§ 371 (c)(1),
(2) Date: Jan. 2, 2018

(87) PCT Pub. No.: WO2017/014287
PCT Pub. Date: Jan. 26, 2017

(65) Prior Publication Data
US 2018/0370207 A1    Dec. 27, 2018

(30) Foreign Application Priority Data

Jul. 22, 2015   (JP) .................................. 2015-145223

(51) Int. Cl.
*B32B 27/34* (2006.01)
*C08J 5/18* (2006.01)
(Continued)

(52) U.S. Cl.
CPC ................. *B32B 27/34* (2013.01); *C08J 5/18* (2013.01); *C08L 79/08* (2013.01); *G02B 1/04* (2013.01);
(Continued)

(58) Field of Classification Search
CPC .... B32B 27/34; B32B 2307/7242; C08J 5/18; C08J 2379/08; G02B 1/04; C08L 79/08;
(Continued)

(56) References Cited

U.S. PATENT DOCUMENTS

| 8,207,256 B2 | 6/2012 | Leu et al. |
| 2005/0048297 A1 | 3/2005 | Fukuda et al. |

(Continued)

FOREIGN PATENT DOCUMENTS

| JP | 2005-068347 A | 3/2005 |
| JP | 2005-187768 A | 7/2005 |

(Continued)

OTHER PUBLICATIONS

International Search Report for PCT/JP2016/071454 (PCT/ISA/210) dated Oct. 18, 2016.
(Continued)

*Primary Examiner* — Michael C Miggins
(74) *Attorney, Agent, or Firm* — Birch, Stewart, Kolasch & Birch, LLP

(57) ABSTRACT

A resin film 10 comprising a polyimide-based polymer is disclosed. The resin film 10 has a tensile elastic modulus of
(Continued)

4.0 GPa or more. In a bending test where the resin film 10 is repeatedly folded into a U-shape until the distance between the resin film faces opposed to each other reaches 3 mm, and unfolded, the number of times of folding the resin film 10 until the resin film 10 fractures is more than 100000.

11 Claims, 6 Drawing Sheets

(51) Int. Cl.
| | | |
|---|---|---|
| G02B 1/04 | (2006.01) | |
| C08L 79/08 | (2006.01) | |
| G02F 1/1337 | (2006.01) | |
| H01L 27/32 | (2006.01) | |
| H01L 51/00 | (2006.01) | |
| H01L 51/52 | (2006.01) | |
| G06F 3/041 | (2006.01) | |

(52) U.S. Cl.
CPC .......... *G02F 1/1337* (2013.01); *H01L 27/323* (2013.01); *H01L 51/0096* (2013.01); *H01L 51/524* (2013.01); *B32B 2307/7242* (2013.01); *C08J 2379/08* (2013.01); *G06F 3/041* (2013.01); *G06F 2203/04102* (2013.01); *H01L 2251/5369* (2013.01); *Y02E 10/50* (2013.01)

(58) Field of Classification Search
CPC . G02F 1/1337; H01L 27/323; H01L 51/0096; H01L 51/524; H01L 2251/5369; Y02E 10/50; G06F 3/041; G06F 2203/04102
See application file for complete search history.

(56) References Cited

U.S. PATENT DOCUMENTS

| | | |
|---|---|---|
| 2008/0161473 A1 | 7/2008 | Leu et al. |
| 2011/0130495 A1 | 6/2011 | Leu et al. |
| 2017/0306093 A1 | 10/2017 | Teruhisa et al. |
| 2017/0342215 A1 | 11/2017 | Takuya et al. |

FOREIGN PATENT DOCUMENTS

| | | |
|---|---|---|
| JP | 2008-163309 A | 7/2008 |
| JP | 2009-215412 A | 9/2009 |
| WO | WO 2015/041190 A1 | 3/2015 |
| WO | WO 2016/060213 A1 | 4/2016 |
| WO | WO 2016/063993 A1 | 4/2016 |
| WO | WO 2016/076243 A1 | 5/2016 |
| WO | WO 2017/014287 A1 | 1/2017 |

OTHER PUBLICATIONS

The International Preliminary Report on Patentability and English translation of the Written Opinion of the International Searching Authority (Forms PCT/IB/338, PCT/IB/373, and PCT/ISA/237), dated Feb. 1, 2018, for International Application No. PCT/JP2016/071454.

Korean Notice of Grounds for Rejection dated Jan. 19, 2018 for corresponding Korean Application No. 10-2017-7023688, with English translation.

(a)

(b)

RESIN FILM, LAMINATE, OPTICAL MEMBER, GAS BARRIER MATERIAL AND TOUCH SENSOR SUBSTRATE

TECHNICAL FIELD

The present invention relates to a resin film, a laminate, an optical member, a gas barrier material and a touch sensor substrate.

BACKGROUND ART

Conventionally, glass has been used as substrates of solar cells or display members which constitutes various display devices such as displays or the like, substrates of optical members and material of the front plate of optical members. However, glass has drawbacks such as being fragile and heavy. Further, glass substrates or glass front plates have no satisfactory material properties responding to the recent trend to make a thinner, light-weight and flexible display. Accordingly, as materials or substrates for replacing glass, acrylic-based resins and laminates in which resins are provided with scratch resistance have been investigated. Composite materials of organic materials and inorganic materials, such as a hybrid film comprising polyimide and silica, have also been investigated (for example, refer to Patent Literature 1 and 2).

CITATION LIST

Patent Literature

Patent Literature 1: Japanese Unexamined Patent Publication No. 2008-163309
Patent Literature 2: U.S. Pat. No. 8,207,256

SUMMARY OF INVENTION

Technical Problem

The resin film for replacing a glass substrate as the substrate of display members, or the substrate or the front plate of optical members, which constitutes flexible devices, may be incorporated into a device as a laminate consisting of an adhesive layer, a resin film and a hard coat layer laminated in this order in some cases (hereinafter referred to as a laminate of adhesive layer/resin film/hard coat layer in some cases). However, the surface hardness of the hard coat layer in the laminate of adhesive layer/resin film/hard coat layer tends to be insufficient, so that it has been shown that there is room for further improvement in that respect.

The present invention, therefore, provides a resin film capable of achieving increase in the surface hardness of the hard coat layer in a laminate of adhesive layer/resin film/hard coat layer.

Solution to Problem

An aspect of the present invention provides a resin film containing a polyimide-based polymer. The tensile elastic modulus of the resin film is 4.0 GPa or more. In a bending test where the resin film is repeatedly folded into a U-shape until the distance between the resin film faces opposed to each other reaches 3 mm, and unfolded, the number of times of folding the resin film until the resin film fractures is more than 100000.

According to the findings of the present inventors, with a resin film containing a polyimide-based polymer satisfying the above requirements on the tensile modulus and bending test, the surface hardness of the hard coat layer in a laminate of adhesive layer/resin film/hard coat layer can be sufficiently increased.

The degree of yellowness of the resin film is preferably 5 or less. Owning to this, when the resin film or the laminate of adhesive layer/resin film/hard coat layer is incorporated into a flexible device, sufficient visibility tends to be easily obtained.

The resin film may have a thickness of 30 to 100 μm. According to the resin film having such a thickness, even more remarkable effects of the present invention can be obtained.

The resin film can be suitably used as an optical member, a gas barrier material or a touch sensor substrate of flexible devices or the like.

Advantageous Effects of Invention

According to the present invention, with regard to a resin film containing a polyimide-based polymer, the surface hardness of the hard coat layer in a laminate of adhesive layer/resin film/hard coat layer can be increased.

DESCRIPTION OF EMBODIMENTS

Preferred embodiments of the present invention are described in detail as follows. The present invention, however, is not limited to the following embodiments. In each of the drawings, the same symbols are given to the same or corresponding elements, and a redundant description may be omitted in some cases.

Figure 1:
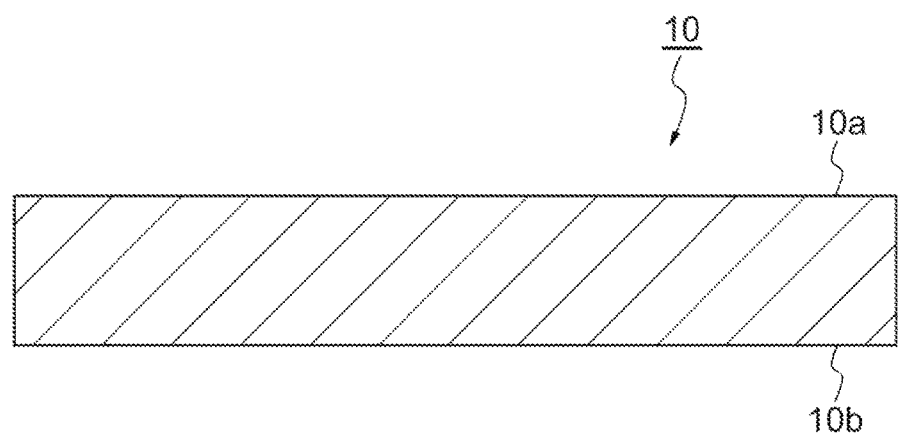
FIG. 1 is a cross-sectional view showing a resin film according to an embodiment.

Resin film FIG. 1 is a cross-sectional view showing a resin film according to an embodiment. The resin film 10 shown in FIG. 1 contains a polyimide-based polymer, having a pair of principal faces 10a and 10b opposed to each other.

The tensile elastic modulus of the resin film 10 is 4.0 GPa or more. In a bending test where the resin film 10 is repeatedly folded into a U-shape until the distance between the resin film faces opposed to each other reaches 3 mm, and unfolded, the number of times of folding the resin film 10 until the resin film 10 fractures is more than 100000. In the present specification, the number of times the resin film is folded in the bending test is sometimes referred to as "number of times of bending".

With the resin film 10 containing the polyimide-based polymer satisfying the above requirements on the tensile modulus and the bending test, the surface hardness of the hard coat layer in a laminate of adhesive layer/resin film/ hard coat layer can be sufficiently enhanced.

Figure 2:
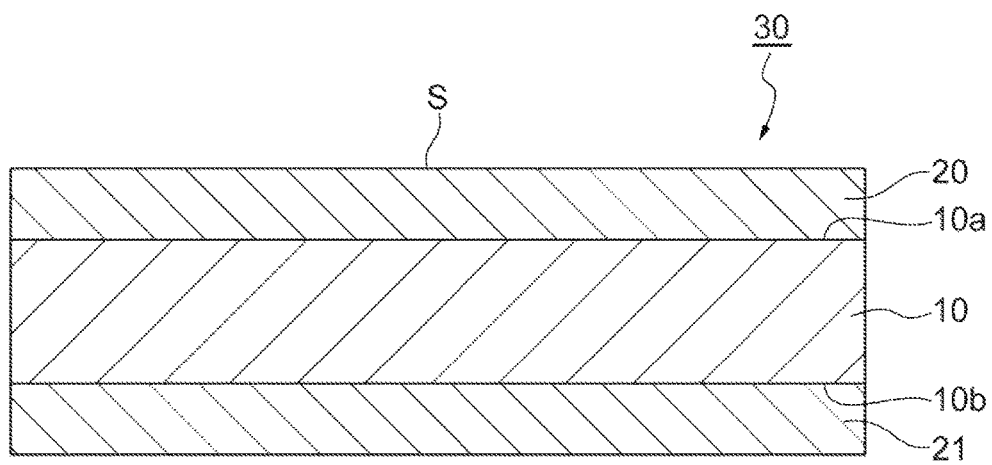
FIG. 2 is a cross-sectional view showing a laminate according to an embodiment.

FIG. 2 is a cross-sectional view showing the laminate of adhesive layer/resin film/hard coat layer according to an embodiment. The laminate 30 shown in FIG. 2 is a laminate having a resin film 10, a functional layer 20 laminated on one principal face 10a of the resin film 10, and a functional layer 21 laminated on another principal face 10b of the resin film 10. According to the resin film 10 of the present embodiment, in the case that the functional layer 20 is a hard coat layer and the functional layer 21 is an adhesive layer, the hardness of the surface S of the functional layer (hard coat layer) 20 can be enhanced. The detail of the hard coat layer and the adhesive layer as the functional layers 20 and 21 is described below.

Tensile elastic modulus of the resin film 10 is 4 GPa or more, preferably 5 GPa or more, and preferably 10 GPa or less, more preferably 8 GPa or less. With a tensile elastic modulus in these numerical ranges, excellent effects can be obtained with respect to bending recovery in addition to improvement of the hardness of the surface S.

The number of times of bending until the resin film 10 fractures in the bending test is more than 100000. In the bending test, the term "a resin film fractures" means that the resin film fractures partially or totally, that is, divided portions occur throughout the thickness direction. In the case that a resin film does not fractures when the number of times of bending until the resin film fractures reaches 100000, the number of times of bending is regarded to be more than 100000. According to the findings of the present inventors, the contribution of a resin film to the enhancement of the hardness of the surface S can be evaluated based on the bending test up through a number of times of bending of 100000. The detail of the bending test is described in Examples below.

The degree of yellowness (YI value) of the resin film 10 is preferably 5 or less, more preferably 4 or less, and still more preferably 3 or less, from the viewpoint of visibility of flexible devices or the like. The degree of yellowness of the resin film 10 is usually 0.5 or more, and may be 1 or more.

The resin film 10 contains a polyimide-based polymer. In the present specification, the polyimide-based polymer means a polymer containing at least one of the repeating structural units represented by a formula (PI), a formula (a), a formula (a') or a formula (b). Among them, the repeating structural unit represented by the formula (PI) is preferably a main structural unit of the polyimide-based polymer from the viewpoints of the strength and the transparency of the film. The content of the repeating structural unit represented by the formula (PI) relative to the total of the repeating structural units of the polyimide-based polymer is preferably 40 mol % or more, more preferably 50 mol % or more, still more preferably 70 mol % or more, particularly preferably 90 mol % or more, and particularly more preferably 98 mol %.

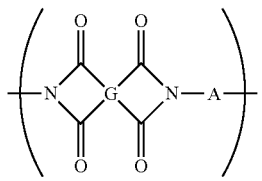

(PI)

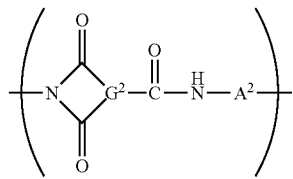

(a)

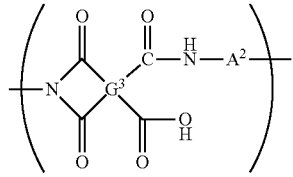

(a')

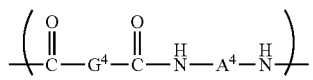

(b)

In the formula (PI), G represents a tetravalent organic group, and A represents a divalent organic group. In the formula (a), $G^2$ represents a trivalent organic group, and $A^2$ represents a divalent organic group. In the formula (a'), $G^3$ represents a tetravalent organic group, and $A^3$ represents a divalent organic group. In the formula (b), $G^4$ and $A^4$ represent divalent organic groups, respectively.

In the formula (PI), examples of the organic group of the tetravalent organic group represented by G (hereinafter, referred to as organic group of G in some cases) include a group selected from the group consisting of a noncyclic aliphatic group, a cyclic aliphatic group, and an aromatic group. The organic group of G is preferably a tetravalent cyclic aliphatic group, or a tetravalent aromatic group from the viewpoints of transparency and flexibility of the resin film 10. Examples of the aromatic group include a monocyclic aromatic group, a fused polycyclic aromatic group, and a non-fused polycyclic aromatic group having two or more aromatic rings linked to each other directly or through a bonding group. From the viewpoints of transparency and reduction in coloration of the resin film, the organic group of G is preferably a cyclic aliphatic group, a cyclic aliphatic group having a fluorine-based substituent, a monocyclic aromatic group having a fluorine-based substituent, a fused polycyclic aromatic group having a fluorine-based substituent, or a non-fused polycyclic aromatic group having a fluorine-based substituent. In the present specification, the fluorine-based substituent means a group containing a fluorine atom. The fluorine-based substituents are preferably a fluoro group (fluorine atom, —F) and a perfluoroalkyl group, more preferably a fluoro group and a trifluoromethyl group.

More specifically, the organic group of G is selected from, for example, a saturated or unsaturated cycloalkyl group, a saturated or unsaturated heterocycloalkyl group, an aryl group, a heteroaryl group, an arylalkyl group, an alkylaryl group, a heteroalkylaryl group, and a group having any two of these groups (wherein the two may be the same) linked to each other directly or through a bonding group. Examples of the bonding group include —O—, an alkylene group having 1 to 10 carbon atoms, —SO$_2$—, —CO— or —CO—NR— (wherein R represents an alkyl group having 1 to 3 carbon atoms such as a methyl group, an ethyl group, and a propyl group, or a hydrogen atom).

The number of carbon atoms of the tetravalent organic group represented by G is usually 2 to 32, preferably 4 to 15, more preferably 5 to 10, still more preferably 6 to 8. In the case that the organic group of G is a cyclic aliphatic group or an aromatic group, at least one of the carbon atoms constituting these groups may be replaced by a hetero atom. Examples of the hetero atom include O, N, and S.

Specific examples of G include a group represented by the following formula (20), formula (21), formula (22), formula (23), formula (24), formula (25) or formula (26). In the formulas, * represents a bonding hand. In the formula (26), Z represents a single bond, —O—, —CH$_2$—, —C(CH$_3$)$_2$—, —Ar—O—Ar—, —Ar—CH$_2$—Ar—, —Ar—C(CH$_3$)$_2$—Ar—, or —Ar—SO$_2$—Ar—. The Ar represents an aryl group having 6 to 20 carbon atoms, and may be, for example, a phenylene group. At least one of the hydrogen atoms of these groups may be substituted with a fluorine-based substituent.

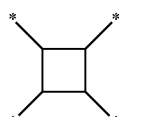

(20)

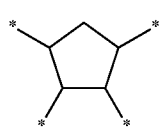

(21)

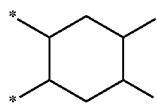

(22)

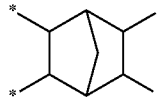

(23)

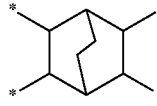

(24)

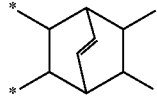

(25)

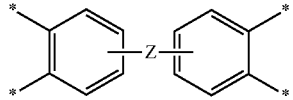

(26)

Examples of the organic group of the divalent organic group represented by A in the formula (PI) (hereinafter, referred to as organic group of A in some cases) include a group selected from the group consisting of a noncyclic aliphatic group, a cyclic aliphatic group, and an aromatic group. The divalent organic group represented by A is preferably selected from a divalent cyclic aliphatic group and a divalent aromatic group. Examples of the aromatic group include a monocyclic aromatic group, a fused polycyclic aromatic group, and a non-fused polycyclic aromatic group having 2 or more aromatic rings linked to each other directly or through a bonding group. From the viewpoints of transparency and reduction in coloration of the resin film, preferably a fluorine-based substituent is introduced into the organic group of A.

More specifically, the organic group of A is selected from, for example, a saturated or unsaturated cycloalkyl group, a saturated or unsaturated heterocycloalkyl group, an aryl group, a heteroaryl group, an arylalkyl group, an alkylaryl group, a heteroalkylaryl group, and a group having any two of these groups (wherein the two may be the same) linked to each other directly or through a bonding group. Examples of the hetero atom include O, N, or S, and examples of the bonding group include —O—, an alkylene group having 1 to 10 carbon atoms, —SO$_2$—, —CO— or —CO—NR— (wherein R represents an alkyl group having 1 to 3 carbon atoms such as a methyl group, an ethyl group, and a propyl group, or a hydrogen atom).

The number of carbons of the divalent organic group represented by A is usually 2 to 40, preferably 5 to 32, more preferably 12 to 28, and still more preferably 24 to 27.

Specific examples of A include a group represented by the following formula (30), formula (31), formula (32), formula (33) or formula (34). In the formulas, * represents a bonding hand. $Z^1$ to $Z^3$ each independently represent a single bond, —O—, —CH$_2$—, —C(CH$_3$)$_2$—, —SO$_2$—, —CO— or —CO—NR— (wherein R represents an alkyl group having 1 to 3 carbon atoms such as a methyl group, an ethyl group, and a propyl group, or a hydrogen atom). In the following groups, $Z^1$ and $Z^2$, and $Z^2$ and $Z^3$ are located preferably at meta positions or para positions of each ring, respectively. Furthermore, $Z^1$ and the single bond at the end, $Z^2$ and the single bond at the end, and $Z^3$ and the single bond at the end are located preferably at meta positions or para positions, respectively. In one example of A, $Z^1$ and $Z^3$ are —O—, and $Z^2$ is —CH$_2$—, —C(CH$_3$)$_2$— or —SO$_2$—. One or two or more of the hydrogen atoms of these groups may be substituted with a fluorine-based substituent.

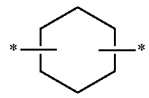

(30)

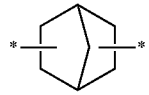

(31)

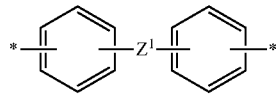

(32)

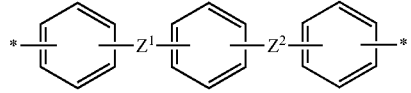

(33)

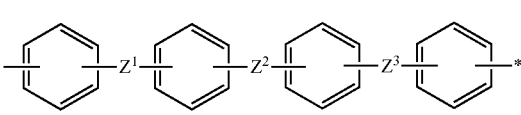

(34)

At least one hydrogen atom of the hydrogen atoms constituting at least one of A or G may be substituted with at least one functional group selected form the group consisting of a fluorine-based substituent, a hydroxyl group, a sulfonic group, and an alkyl group having 1 to 10 carbon atoms. Further, in the case that each of the organic group of A and the organic group of G is a cyclic aliphatic group or an aromatic group, preferably at least one of A or G has a fluorine-based substituent, more preferably both A and G have a fluorine-based substituent.

In formula (a), $G^2$ is a trivalent organic group. The organic group may be selected from the same groups as the organic groups of G in the formula (PI), except being a trivalent group. Examples of $G^2$ include the groups represented by the formulas (20) to (26) as specific examples of G, having any one of the four bonding hands substituted with a hydrogen atom. In the formula (a), $A^2$ may be selected from the same groups as A in the formula (PI).

In the formula (a'), $G^3$ may be selected from the same groups as G in the formula (PI). In the formula (a'), $A^3$ may be selected from the same groups as A in formula (PI).

In the formula (b), $G^4$ is a divalent organic group. The organic group may be selected from the same groups as the organic groups of G in the formula (PI), except being a divalent group. Examples of $G^4$ include the groups represented by the formulas (20) to (26) as specific examples of G having any two of the four bonding hands substituted with hydrogen atoms. In the formula (b), $A^4$ may be selected from the same groups as A in the formula (PI).

The polyimide-based polymer contained in the resin film 10 may be a condensation polymer obtained by polycondensing a diamine with at least one of a tetracarboxylic acid compound (including tetracarboxylic acid compound analogs such as an acid chloride compound and tetracarboxylic acid dianhydride) or a tricarboxylic acid compound (including tricarboxylic acid compound analogs such as an acid chloride compound and tricarboxylic acid anhydride). A dicarboxylic acid compound (including analogs such as an acid chloride compound) may be further polycondensed. The repeating structural unit represented by the formula (PI) or the formula (a') is usually derived from a diamine and a tetracarboxylic acid compound. The repeating structural unit represented by the formula (a) is usually derived from a diamine and a tricarboxylic acid compounds. The repeating structural unit represented by the formula (b) is usually derived from a diamine and a dicarboxylic acid compound.

Examples of the tetracarboxylic acid compound include an aromatic tetracarboxylic acid compound, an alicyclic tetracarboxylic acid compound and a noncyclic aliphatic tetracarboxylic acid compound. These may be used in combination of two or more. The tetracarboxylic acid compound is preferably a tetracarboxylic dianhydride. Examples of the tetracarboxylic dianhydride include an aromatic tetracarboxylic acid dianhydride, an alicyclic tetracarboxylic acid dianhydride, and a noncyclic aliphatic tetracarboxylic acid dianhydride.

From the viewpoints of the solubility of a polyimide-based polymer in solvent and the transparency and flexibility of resin film 10 to be formed, the tetracarboxylic acid compound is preferably an alicyclic tetracarboxylic compound or an aromatic tetracarboxylic acid compound. From the viewpoints of the transparency and reduction in coloration of the resin film, preferably the tetracarboxylic acid compound is selected from an alicyclic tetracarboxylic acid compound having a fluorine-based substituent and an aromatic tetracarboxylic acid compound having a fluorine-based substituent, and more preferably is an alicyclic tetracarboxylic acid compound having a fluorine-based substituent.

Examples of the tricarboxylic acid compound include an aromatic tricarboxylic acid, an alicyclic tricarboxylic acid, a noncyclic aliphatic tricarboxylic acid, and an acid chloride compound and an acid anhydride of analogues thereof. The tricarboxylic acid compound is preferably selected from an aromatic tricarboxylic acid, an alicyclic tricarboxylic acid, a noncyclic aliphatic tricarboxylic acid, and an acid chloride compound of analogues thereof. The tricarboxylic acid compound may be used in combination of two or more.

From the viewpoints of the solubility of the polyimide-based polymer in solvent and the transparency and flexibility of resin film 10 to be formed, the tricarboxylic acid compound is preferably an alicyclic tricarboxylic acid compound or an aromatic tricarboxylic acid compound. From the viewpoints of the transparency and the reduction in coloration of the resin film, the tricarboxylic acid compound is more preferably an alicyclic tricarboxylic acid compound having a fluorine-based substituent or an aromatic tricarboxylic acid compound having a fluorine-based substituent.

Examples of the dicarboxylic acid compound include an aromatic dicarboxylic acid, an alicyclic dicarboxylic acid, a noncyclic aliphatic dicarboxylic acid, and an acid chloride compound and an acid anhydride of analogs thereof. The dicarboxylic acid compound is preferably selected from an aromatic dicarboxylic acid, an alicyclic dicarboxylic acid, a noncyclic aliphatic dicarboxylic acid, and an acid chloride compound of analogs thereof. The dicarboxylic acid compound may be used in combination of two or more.

From the viewpoints of the solubility of the polyimide-based polymer in solvent and the transparency and flexibility of a resin film 10 to be formed, the dicarboxylic acid compound is preferably an alicyclic dicarboxylic acid compound or an aromatic dicarboxylic acid compound. From the viewpoints of the transparency and the reduction in coloration of the resin film, the dicarboxylic acid compound is more preferably an alicyclic dicarboxylic acid compound having a fluorine-based substituent or an aromatic dicarboxylic acid compound having a fluorine-based substituent.

Examples of the diamine include an aromatic diamine, an alicyclic diamine and an aliphatic diamine, which may be used in combination of two or more. From the viewpoints of the solubility of the polyimide polymer in solvent and the transparency and flexibility of a resin film 10 to be formed, the diamine is preferably selected from an alicyclic diamine and an aromatic diamine having a fluorine-based substituent.

With use of such a polyimide-based polymer, a resin film having particularly excellent flexibility, high light transmittance (e.g. 85% or higher, preferably 88% or higher for light at 550 nm), low degree of yellowness (YI value: 5 or less, preferably 3 or less), and low haze (1.5% or less, preferably 1.0% or less) tends to be obtained.

The polyimide-based polymer may be a copolymer comprising a plurality of different types of the repeating structural units. The weight average molecular weight of the polyimide-based polymer is typically 10,000 to 500,000. The weight average molecular weight of the polyimide-based polymer is preferably 50,000 to 500,000, more preferably 70,000 to 400,000. The weight average molecular weight is a molecular weight in terms of standard polystyrene measured by gel permeation chromatography (GPC). With a large weight average molecular weight of the polyimide-based polymer, high flexibility tends to be obtained. However, with a too large weight average molecular weight of the polyimide-based polymer, the viscosity of varnish increases, so that the process-ability tends to decrease.

The polyimide-based polymer may contain a halogen atom such as a fluorine atom which can be introduced by the fluorine-based substituent or the like described above. With the polyimide-based polymer containing a halogen atom, the elastic modulus of a resin film can be increased, and the degree of yellowness can be decreased. Thereby, scratches, wrinkles and the like occurring in a resin film can be reduced, and the transparency of a resin film can be enhanced. The halogen atom is preferably a fluorine atom. The content of halogen atom in the polyimide-based polymer is preferably 1 mass % to 40 mass %, more preferably 1 mass % to 30 mass %, based on the mass of the polyimide-based polymer.

The resin film 10 may contain one or two or more types of ultraviolet absorbers. The ultraviolet absorber may be appropriately selected from ones commonly used as ultraviolet absorbers in the field of resin materials. The ultraviolet absorbers may contain a compound which absorbs light having a wavelength of 400 nm or less. Examples of the ultraviolet absorber which may be appropriately combined with a polyimide-based polymer include at least one selected from the group consisting of a benzophenone-based compound, a salicylate-based compound, a benzotriazole-based compound, and a triazine-based compound.

According to the present specification, a "-based compound" refers to derivatives of the compound to which the term "-based compound" is attached. For example, a "benzophenone-based compound" refers to a compound having benzophenone as mother skeleton and a substituent that is bonded to the benzophenone.

The content of the ultraviolet absorber relative to the total mass of the resin film is typically 1 mass % or more, preferably 2 mass % or more, more preferably 3 mass % or more, and typically 10 mass % or less, preferably 8 mass % or less, and more preferably 6 mass % or less. With an ultraviolet absorber content in these ranges, the weather resistance of the resin film 10 can be enhanced.

The resin film 10 may further contain an inorganic material such as inorganic particles. The inorganic material is preferably silicon materials containing silicon atoms. The resin film 10 containing inorganic material such as silicon material can easily have a tensile elastic modulus of 4.0 GPa or more. However, the method for controlling the tensile elastic modulus of the resin film 10 is not limited to the mixing of inorganic material.

Examples of the silicon material containing silicon atoms include silicon compounds such as silica particles, quaternary alkoxysilanes such as tetraethyl orthosilicate (TEOS), and silsesquioxane derivatives. Among these silicon materials, silica particles are preferred from the viewpoints of transparency and flexibility of the resin film 10.

The average primary particle diameter of silica particles is typically 100 nm or less. With an average primary particle diameter of silica particles of 100 nm or less, the transparency tends to increase.

The average primary particle size of silica particles in the resin film can be determined through observation by transmission electron microscopy (TEM). The primary particle size of silica particles may be a directed diameter obtained by transmission electron microscopy (TEM). The average primary particle size may be determined as the average of the primary particle sizes measured at 10 points through TEM observation. The particle size distribution of the silica particles before the resin film is formed can be determined by a commercially available laser diffraction type particle size distribution analyzer.

In regard to the resin film 10, the mixing ratio between the polyimide-based polymer and the inorganic material may be, as a mass ratio with 10 in total of both, preferably 1:9 to 10:0, more preferably 3:7 to 10:0, still more preferably 3:7 to 8:2, and furthermore preferably 3:7 to 7:3. The proportion of the inorganic material with respect to the total mass of the polyimide-based polymer and the inorganic material is typically 20 mass % or more, preferably 30 mass % or more, and typically 90 mass % or less, preferably 70 mass % or less. With a mixing ratio between the polyimide-based polymer and the inorganic material (silicon material) within the range described above, transparency and mechanical strength of the resin film tend to increase. Also, the tensile elastic modulus of the resin film 10 can be easily 4.0 GPa or more.

The resin film 10 may further contain components other than the polyimide-based polymer and the inorganic material to the extent that transparency and flexibility are not noticeably impaired. Examples of the component other than the polyimide-based polymer and the inorganic material include an oxidation inhibitor, a mold release agent, a stabilizer, a colorant such as bluing agent, a flame retardant, a lubricating agent, a thickener and a leveling agent. The ratio of the components other than the polyimide-based polymer and the inorganic material relative to the mass of the resin film 10 is preferably more than 0% to 20 mass % or less, more preferably more than 0% to 10 mass % or less.

In the case of the resin film 10 containing the polyimide-based polymer and the silicon material, Si/N that is an atomic ratio of silicon atoms with respect to nitrogen atoms in at least one principal face 10a is preferably 8 or more. This atomic ratio Si/N is a value obtained by evaluating the composition of the principal face 10a by X-ray photoelectron spectroscopy (XPS), and calculating the value from the abundance of silicon atoms and the abundance of nitrogen atom obtained by this evaluation.

With an Si/N in the principal face 10a of the resin film 10 of 8 or more, sufficient adhesiveness to a functional layer 20 that will be described later is obtained. From the viewpoint of adhesiveness, Si/N is preferably 9 or more, more preferably 10 or more, and preferably 50 or less, more preferably 40 or less.

The thickness of the resin film 10 is appropriately adjusted depending on the flexible device to which a laminate 30 is applied, being typically 10 μm to 500 μm, preferably 15 μm to 200 μm, more preferably 20 μm to 100 μm, still more preferably 30 μm to 100 μm. The thickness of the resin film 10 is particularly preferably 50 μm to 100 μm, most preferably 70 μm to 90 μm. The resin film 10 having such a configuration can have particularly excellent flexibility and a sufficient strength in practical use.

Next, an example of the method for manufacturing the resin film 10 of the present embodiment will be described. A polyimide-based polymer varnish for use in manufacturing of the resin film is prepared by dissolving a solvent-soluble polyimide-based polymer polymerized by a known synthesis technique of polyimide-based polymers in a solvent. The solvent may be any solvent that dissolves polyimide-based polymer, and examples thereof include N,N-dimethylacetamide (DMAc), N,N-dimethylformamide (DMF), dimethyl sulfoxide (DMSO), γ-butyrolactone (GBL), and mixed solvents thereof.

In the case of manufacturing a resin film containing an inorganic material, an inorganic material is added to the polyimide-based polymer varnish, and the mixture is stirred and mixed by a known stirring method. Thus, a dispersion liquid in which the silicon material is uniformly dispersed is prepared. In the case of mixing an ultraviolet absorber, the ultraviolet absorber may be added to the dispersion liquid.

The polyimide-based polymer varnish or the dispersion liquid may comprise a metal alkoxide such as alkoxysilane which contributes to bond forming between inorganic particles (silica particles or the like). With use of a dispersion liquid comprising such a compound, the mixing proportion of the inorganic particles can be made large while the optical characteristics such as transparency of the resin film are maintained. The compound is preferably an alkoxysilane having an amino group. The combination of the compound with the inorganic particles achieves a high elastic modulus and can contributes to the increase in the number of times of bending until the resin film fractures in bending test.

The polyimide-based polymer varnish or the dispersion liquid may further comprise water. The water content is typically 0.1 to 10 mass % relative to the mass of the polyimide-based polymer varnish or the dispersion liquid. The use of water also achieves a high elastic modulus and contributes to the increase in the number of times of bending until the resin film fractures in bending test.

The polyimide-based polymer or the dispersion liquid may further comprise additives. Examples of the additives include an oxidation inhibitor, a mold release agent, a stabilizer, a colorant such as bluing agent, a flame retardant, a lubricating agent, a thickener and a leveling agent.

The resin film may be manufactured by an appropriate known method. Examples of the manufacturing method include the following method. The polyimide-based polymer varnish or the dispersion liquid is applied to a substrate by, for example, a known roll-to-roll or batch system, to form a coating film. The coating film is dried, and thus a film is formed. Subsequently, the film is peeled off from the substrate, and thereby a resin film 10 is obtained. Examples of the substrate include a polyethylene terephthalate (PET) substrate, a stainless steel (SUS) belt, or a glass substrate.

For drying and/or baking of the coating film, the coating film may be heated. The heating temperature of the coating film is typically 50° C. to 350° C. The heating of the coating film may be performed in an inert atmosphere or under reduced pressure. The solvent can be evaporated for removal by heating the coating film. The resin film may also be formed by a method including drying the coating film at 50° C. to 150° C., and baking the coating film after drying at 180° C. to 350° C.

At least one principal face of the resin film may be subjected to a surface treatment. Preferably, the surface treatment is a UV ozone treatment. Si/N can be easily adjusted to 8 or more by a UV ozone treatment. However, the method for adjusting Si/N to 8 or more is not limited to the UV ozone treatment.

The principal faces 10a and/or 10b of the resin film 10 may be subjected to a surface treatment such as a plasma treatment or a corona discharge treatment, in order to enhance adhesiveness to the functional layer that will be described below.

The UV ozone treatment can be carried out by using a known ultraviolet light source having a wavelength of 200 nm or less. Examples of the ultraviolet light source include a low pressure mercury lamp. As the ultraviolet light source, various commercially available apparatuses equipped with an ultraviolet light source may also be used. Examples of the commercially available apparatuses include an ultraviolet (UV) ozone cleaning apparatus UV-208 manufactured by Technovision, Inc.

The resin film 10 of the present embodiment thus obtained has excellent flexibility. Furthermore, in at least one principal face 10a, when the case of Si/N, which is an atomic ratio between silicon atoms and nitrogen atoms, is adjusted to 8 or more, excellent adhesiveness to a functional layer 20 that will be described below can be obtained.

Laminate

Figure 3:
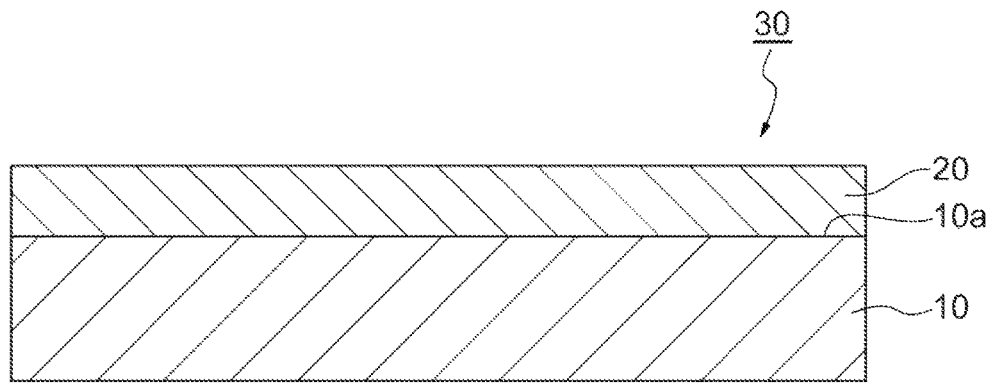
FIG. 3 is a cross-sectional view showing a laminate according to an embodiment.

FIG. 3 is a cross-sectional view showing a laminate according to an embodiment. The laminate 30 shown in FIG. 3 is a laminate including a resin film 10 and a functional layer 20 laminated on one of the principal face 10a of the resin film 10.

In the case of using the laminate 30 as the substrate of optical members or display members, or the front plate, of a flexible device, the functional layer 20 can be a layer for further imparting a function (performance) to the laminate 30. In the present specification, the optical member means a sensor part or a signal transmitting part such as a touch sensor in display devices, and the display member means an image display part of organic EL display devices or liquid crystal display devices, respectively.

Preferably, the functional layer 20 is a layer having at least one function selected from the group consisting of ultraviolet absorption, surface hardness enhancement, adhesiveness, color adjustment, and refractive index adjustment.

A layer having the function of ultraviolet absorption (ultraviolet absorbing layer) as the functional layer 20 is configured to include, for example, a main material selected from an ultraviolet-curable type transparent resin, an electron beam-curable type transparent resin, and a thermosetting type transparent resin; and an ultraviolet absorber dispersed in this main material. By providing an ultraviolet absorbing layer as the functional layer 20, a change in the degree of yellowness caused by light irradiation can be easily suppressed.

The ultraviolet-curable type, electron beam-curable type, or thermosetting type transparent resin as the main material of the ultraviolet absorbing layer is not particularly limited; and examples thereof include poly(meth)acrylate. The ultraviolet absorber may be selected from the same compounds given as examples of the ultraviolet absorbers that can be contained in the resin film 10.

The ultraviolet absorbing layer may be a layer which absorbs 95% or more of light having a wavelength of 400 nm or less (for example, light having a wavelength of 313 nm). In other words, the ultraviolet absorbing layer may be a layer in which the transmittance for light having a wavelength of 400 nm or less (for example, light having a wavelength of 313 nm) is less than 5%. The ultraviolet absorbing layer can include an ultraviolet absorber at a concentration at which such a transmittance can be obtained. From the viewpoint of suppressing an increase in the degree of yellowness of the laminate caused by light irradiation, the proportion of the ultraviolet absorber content in the ultraviolet absorbing layer (functional layer 20) is typically 1 mass % or more, preferably 3 mass % or more, and typically 10 mass % or less, preferably 8 mass % or less, based on the mass of the ultraviolet absorbing layer.

A layer having a function of surface hardness enhancement (hard coat layer) as the functional layer 20 is, for example, a layer that imparts a surface having a pencil hardness higher than the pencil hardness of the surface of the resin film, to the laminate. This hard coat layer is not particularly limited, and may include an ultraviolet-curable type, electron beam-curable type, or thermosetting type resin, which is represented by a poly(meth)acrylate. The hard coat layer may include a photopolymerization initiator and an organic solvent. The poly(meth)acrylate is a poly (meth)acrylate formed from, for example, one or more (meth)acrylates selected from a polyurethane (meth)acrylate, an epoxy (meth)acrylate, and other polyfunctional poly(meth)acrylates. The hard coat layer may further include inorganic oxides such as silica, alumina and polyorganosiloxane, in addition to the components described above.

A functional layer having a function of adhesiveness (adhesive layer) as the functional layer 20 has a function of adhering the laminate 30 to another member. Examples of the material for forming the adhesive layer include a thermosetting resin composition or a photocurable resin composition.

The adhesive layer may be formed from a resin composition that includes a component having a polymerizable functional group. In this case, strong adhesion can be achieved by adhering the laminate 30 to another member, and then further polymerizing the resin composition that constitute the adhesive layer. The adhesive strength between the resin film 10 and the adhesive layer is preferably 0.1 N/cm or more, more preferably 0.5 N/cm or more.

The adhesive layer may include a thermosetting resin composition or a photocurable resin composition as a material. In this case, the resin composition can be cured by converting the resin composition into a polymer by supplying energy afterwards.

The adhesive layer may be a layer that is stuck to an object by pressing, which is referred to as a pressure-sensitive adhesive (PSA). The pressure-sensitive adhesive may be "a substance that has pressure-sensitive adhesiveness at normal temperature and adheres to an adherend material under light pressure" (JIS K6800), or may be a capsule type adhesive which is "an adhesive that internally contains a particular component in a protective coating film (microcapsule) and retains stability until the coating film is destroyed by appropriate means (pressure, heat or the like)" (JIS K6800).

A layer having a function of color adjustment (color adjusting layer) as the functional layer 20 is a layer with which the laminate 30 can be adjusted to an intended color. The color adjusting layer may be, for example, a layer containing a resin and a colorant. Examples of the colorant include inorganic pigments such as titanium oxide, zinc oxide, colcothar, a titanium oxide-based calcined pigment, ultramarine blue, cobalt aluminate, and carbon black; organic pigments such as an azo-based compound, a quinacridone-based compound, an anthraquinone-based compound, a perylene-based compound, an isoindolinone-based compound, a phthalocyanine-based compound, a quinophthalone-based compound, an indanthrene-based compound, and a diketopyrrolopyrrole-based compound; extender pigments such as barium sulfate and calcium carbonate; and dyes such as a basic dye, an acidic dye, and a mordant dye.

A layer having a function of refractive index adjustment (refractive index adjusting layer) as the functional layer 20 is a layer which has a refractive index that is different from that of the resin film 10, and can impart a predetermined refractive index to the laminate. The refractive index adjusting layer may be, for example, a resin layer containing an appropriately selected resin and optionally further containing a pigment, or may be a thin film of metal.

Examples of the pigment that adjusts the refractive index include silicon oxide, aluminum oxide, antimony oxide, tin oxide, titanium oxide, zirconium oxide, and tantalum oxide. The average particle size of the pigment is preferably 0.1 μm or less. By adjusting the average particle size of the pigment to 0.1 μm or less, diffused reflection of light transmitted through the refractive index adjusting layer is prevented, and the decrease in transparency can be prevented.

Examples of the metal that is used for the refractive index adjusting layer include metal oxides or metal nitrides, such as titanium oxide, tantalum oxide, zirconium oxide, zinc oxide, tin oxide, silicon oxide, indium oxide, titanium oxynitride, titanium nitride, silicon oxynitride, and silicon nitride.

The functional layer 20 appropriately has the above-described functions according to the use of the laminate 30. The functional layer 20 may be a single layer, or may be a plurality of layers. Each layer may have one function or two or more functions.

Preferably, the functional layer 20 has functions of surface hardness enhancement and ultraviolet absorption. Preferably the functional layer 20 in this case include "a single layer having functions of surface hardness enhancement and ultraviolet absorption", "multilayers including a layer having functions of surface hardness enhancement and ultraviolet absorption", or "multilayers including a single layer having functions of surface hardness enhancement and ultraviolet absorption and a layer having high hardness".

The thickness of the functional layer 20 is appropriately adjusted according to the flexible device to which the laminate 30 is applied; being preferably 1 μm to 100 μm, more preferably 2 μm to 80 μm. The functional layer 20 is typically thinner than the resin film 10.

The laminate 30 can be obtained by forming the functional layer 20 on the principal face 10a of the resin film 10. The functional layer 20 can be formed by a known roll-to-roll or batch system.

An ultraviolet absorbing layer as the functional layer 20 can be formed by, for example, applying a dispersion liquid including an ultraviolet absorber and main materials such as a resin in which the ultraviolet absorber is dispersed, to the principal face 10a of the resin film 10, thereby forming a coating film, and drying and curing the coating film.

A hard coat layer as the functional layer 20 can be formed by, for example, applying a solution including the resin to form the hard coat layer onto the principal face 10a of the resin film 10, thereby forming a coating film, and drying and curing the coating film.

An adhesive layer as the functional layer 20 can be formed by, for example, applying a solution including a adhesive to form an adhesive layer onto the principal face 10a of the resin film 10, thereby forming a coating film, and drying and curing the coating film.

A color adjusting layer as the functional layer 20 can be formed by, for example, applying a dispersion liquid including a pigment to form a color adjusting layer and main materials such as a resin in which the pigment and the like are dispersed, onto the principal face 10a of the resin film 10, thereby forming a coating film, and drying and curing the coating film.

A refractive index adjusting layer as the functional layer 20 can be formed by, for example, applying a dispersion liquid including inorganic particles to form a refractive index layer and main materials such as a resin in which the inorganic particles and the like are dispersed, onto the principal face 10a of the resin film 10, thereby forming a coating film, and drying and curing the coating film.

A single layer having functions of surface hardness enhancement and ultraviolet absorption as the functional layer 20 can be formed by applying a dispersion liquid including an ultraviolet absorber, main materials such as a resin in which the ultraviolet absorber is dispersed, and a resin to form a hard coat layer, onto the principal face 10a of the resin film 10, thereby forming a coating film, and by drying and curing the coating film. The resin to make the main material and the resin to form the hard coat layer may be the same.

Functional multilayers including layers having functions of surface hardness enhancement and ultraviolet absorption can be formed by the following method.

An ultraviolet absorbing layer is formed by applying a dispersion liquid including an ultraviolet absorber and main materials such as a resin in which the ultraviolet absorber is dispersed, onto the principal face 10a of the resin film 10, thereby forming a coating film, and by drying and curing the coating film. Subsequently, a hard coat layer may be formed by applying a solution including a resin to form a hard coat layer onto the ultraviolet absorbing layer, thereby forming a coating film, and by drying and curing the coating film. According to this method, functional multilayers including a layer having the function of surface hardness enhancement and a layer having the function of ultraviolet absorption are formed.

Functional multilayers including a single layer having functions of surface hardness enhancement and ultraviolet absorption and a layer having high hardness can be formed by the following method.

A single layer having functions of surface hardness enhancement and ultraviolet absorption is formed by applying a dispersing liquid including an ultraviolet absorber and main materials such as a resin in which the ultraviolet absorber is dispersed, and a resin to form a hard coat layer, onto the principal face 10a of the resin film 10, thereby forming a coating layer, and by drying and curing the coating film; and further, a hard coat layer may be formed by applying a solution including a resin to form a hard coat layer onto the single layer, thereby forming a coating layer, and by drying and curing the coating film. According to this method, functional multilayers including a layer having functions of surface hardness enhancement and ultraviolet absorption and a layer having surface hardness enhancement are formed.

The laminate 30 thus obtained in the present embodiment is excellent in flexibility. The laminate 30 can have functional properties such as transparency, ultraviolet-resistant characteristics, and surface hardness enhancement, which are required when applied to the substrate of optical members or display members, or the front plate of a flexible device. In the case of the laminate 30 having Si/N of 8 or more at the principal face 10a of the resin film 10, the adhesiveness between the resin film 10 and the functional layer 20 is also excellent. Further, in the case that the functional layer 20 is a layer having a function of surface hardness enhancement (hard coat layer), the functional layer 20 can have a high surface hardness.

Figure 4:
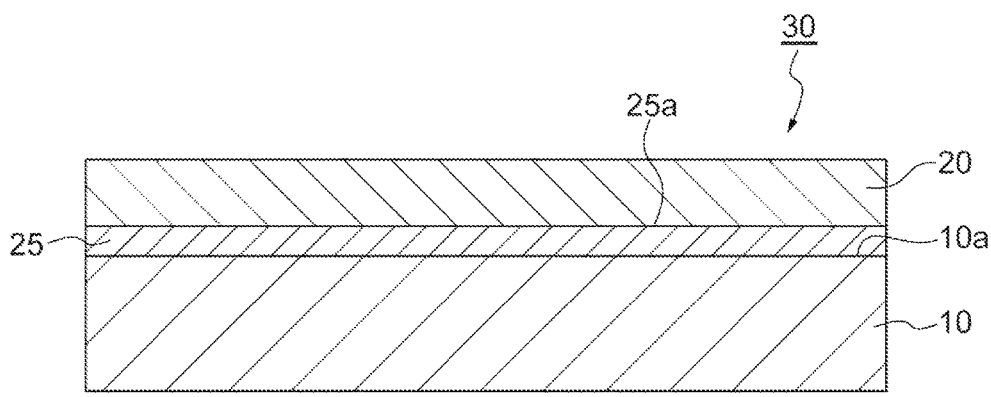
FIG. 4 is a cross-sectional view showing a laminate according to an embodiment.

FIG. 4 is also a cross-sectional view showing the laminate according to an embodiment. In addition to the similar resin film 10 and the functional layer 20 of the laminate in FIG. 3, the laminate 30 shown in FIG. 4 further comprises a primer layer 25 disposed between the resin film 10 and the functional layer 20. The primer layer 25 is laminated on one principal face 10a of the resin film 10. The functional layer 20 is laminated on one principal face 25a of the primer layer 25, on the opposite side of the principal face in contact with the resin film 10.

The primer layer 25 is a layer formed from a primer agent, and it is preferable that the primer layer 25 includes a material that can increase adhesiveness to the resin film 10 and the functional layer 20. The compound included in the primer layer 25 may be chemically bonded to the polyimide-based polymer or the silicon material or the like included in the resin film 10 at the interface.

Examples of the primer agent include primer agents of ultraviolet-curable type, thermosetting type, or two-liquid curable type epoxy-based compounds. The primer agent may be a polyamic acid. These primer agents are suitable for increasing adhesiveness between the resin film 10 and the functional layer 20.

The primer agent may include a silane coupling agent. The silane coupling agent may be chemically bonded to the silicon material included in the resin film 10 by a condensation reaction. The silane coupling agent is useful particularly in the case of a high mixing ratio of the silicon material included in the resin film 10.

Examples of the silane coupling agent include a compound having an alkoxysilyl group, which has a silicon atom and one to three alkoxy groups that are covalently bonded to the silicon atom. A compound including a structure in which two or more alkoxy groups are covalently bonded to a silicon atom is preferred and a compound including a structure in which three alkoxy groups are covalently bonded to a silicon atom is more preferred. Examples of the alkoxy group include a methoxy group, an ethoxy group, an isopropoxy group, an n-butoxy group, and a t-butoxy group. Among them, a methoxy group and an ethoxy group are preferred, as being capable of increasing the reactivity with a silicon material.

Preferably, the silane coupling agent has a substituent with high affinity to the resin film 10 and the functional layer 20. From the viewpoint of affinity with the polyimide-based polymer included in the resin film 10, the substituent of the silane coupling agent is preferably an epoxy group, an amino group, an ureido group, or an isocyanate group. In the case of the functional layer 20 including a (meth)acrylate, preferably the silane coupling agent used for the primer layer 25 has an epoxy group, a methacryl group, an acryl group, an amino group, or a styryl group, as the affinity tends to increase. Among these, a silane coupling agent having a substituent selected from a methacryl group, an acryl group and an amino group exhibits a tendency of having excellent affinity to the resin film 10 and the functional layer 20.

The thickness of the primer layer 25 is appropriately adjusted according to the functional layer 20, preferably being 0.01 nm to 20 μm. In the case of using a primer agent of an epoxy-based compound, the thickness of the primer layer 25 is preferably 0.01 μm to 20 μm, more preferably 0.1 μm to 10 μm. In the case of using a silane coupling agent, the thickness of the primer layer 25 is preferably 0.1 nm to 1 μm, more preferably 0.5 nm to 0.1 μm.

The laminate 30 in FIG. 4 can be manufactured by, for example, a method including the steps of applying a solution in which a primer agent is dissolved onto the principal face 10a of the resin film 10 so as to form a coating film, and drying and curing the coating film thus formed so as to form a primary layer. A method for forming other members is the same as for the laminate 30 in FIG. 3. The primer layer 25 may be cured at the same time as curing of the functional layer 20, or may be separately cured prior to forming of the functional layer 20.

The laminate of the present invention has high transparency and can maintain excellent visibility when being bent. Also, the laminate has excellent flexibility. In the case that a primer layer is disposed between the resin film and the functional layer, the adhesion between the resin film and the functional layer increases. The laminate can have the functional properties such as transparency, ultraviolet-resistant characteristics, and surface hardness, which are required when applied to the substrate of optical members or display members, or the front plate of a flexible device.

The configuration of the resin film and the laminate can be appropriately modified. For example, as with the laminate 30 shown in FIG. 2, functional layers may be disposed on both sides of a resin film, respectively. In that case, a primer layer may be disposed between each of the function layers and the resin film.

Display Device (Flexible Device)

Figure 5:
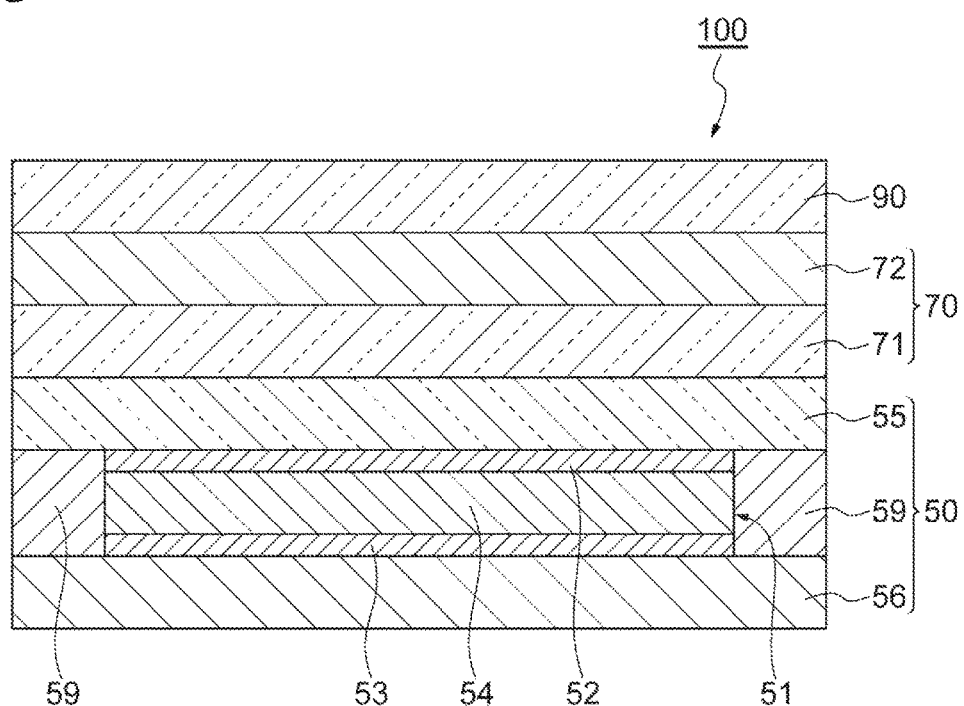
FIG. 5 is a schematic cross-sectional view showing a display device according to an embodiment.

FIG. 5 is a cross-sectional view showing a display device according to an embodiment. The display device 100 shown in FIG. 5 has an organic EL device 50, a touch sensor 70, and a front plate 90. These are typically accommodated in a housing. The organic EL device 50 is bonded to the touch sensor 70, and the touch sensor 70 is bonded to the front plate 90, respectively, with, for example, an optical clear adhesive (OCA) which is not shown in drawing.

The organic EL device 50 is a display member having an organic EL element 51, a first substrate 55, a second substrate 56, and a sealing material 59.

The organic EL element 51 has a pair of electrodes (first electrode 52 and a second electrode 53), and a light emitting layer 54. The light emitting layer 54 is disposed between the first electrode 52 and the second electrode 53.

The first electrode 52 is formed from an electrically conductive material having light transmissibility. The second electrode 53 may also have light transmissibility. As the first electrode 52 and the second electrode 53, known materials can be employed.

The light emitting layer 54 can be formed from a known light emitting material that constitutes an organic EL element. The light emitting material may be any of a low molecular weight compound and a high molecular weight compound.

When electric power is supplied between the first electrode 52 and the second electrode 53, carriers (electrons and holes) are supplied to the light emitting layer 54, and light is generated in the light emitting layer 54. The light generated in the light emitting layer 54 is emitted to the outside of the organic EL device 50 through the first electrode 52 and the first substrate 55.

The first substrate 55 is formed from a material having light transmissibility. The second substrate 56 may have light transmissibility. The first substrate 55 and the second substrate 56 are bonded together by a sealing material 59 that is disposed so as to surround the periphery of the organic EL element. The first substrate 55, the second substrate 56, and the sealing material 59 form a sealing structure sealing the organic EL element in the interior. The first substrate 55 and/or the second substrate 56 are gas barrier materials in many cases.

As the material for forming any one or both of the first substrate 55 and the second substrate 56, an inorganic material such as glass, or a known transparent resin such as an acrylic-based resin can be used. The resin film or the laminate according to the present embodiment described above may be also employed as these members.

The first substrate 55 and the second substrate 56, for which the resin film or the laminate according to the present embodiment can be employed, correspond to the substrate of display members or gas barrier materials according to the present embodiment. An organic EL device 50 having such a first substrate 55 and a second substrate 56 has excellent flexibility due to the employment of the laminate according to the present embodiment.

The touch sensor 70 is an optical member having a touch sensor substrate 71, and an element layer 72 having a detection element formed on the touch sensor substrate 71.

The touch sensor substrate 71 is formed from a material having light transmissibility. As the touch sensor substrate 71, an inorganic material such as glass, or a known transparent resin such as an acrylic-based resin can be used. The resin film or the laminate according to the present embodiment described above can also be employed as the touch sensor substrate 71.

In the element layer 72, a known detection element composed of a semiconductor element, wiring, resistors, and the like is formed. As the configuration of the detection element, a configuration that achieves a known detection system, such as a matrix switch, a resistant film system, or a capacitance type, can be employed.

The touch sensor substrate 71 that can employ the laminate according to the present embodiment corresponds to an optical member according to the present embodiment. The touch sensor 70 having such a touch sensor substrate 71 has excellent flexibility due to the employment of the resin film or the laminate according to the present embodiment.

The front plate 90 is formed from a material having light transmissibility. The front plate 90 is located at the outermost layer on the display screen-side of a display device, and functions as a protective member that protects the display device. The front plate is also referred to as a window film. As the front plate 90, an inorganic material such as glass, or a known transparent resin such as an acrylic-based resin can be used. The resin film or the laminate according to the present embodiment described above may be also employed as the front plate 90. In the case in which a laminate is employed as the front plate 90, the laminate is usually disposed in a direction in which the functional layer is located on the outer side of the display device.

The front plate 90 that can employ a resin film or the laminate according to the present embodiment has excellent flexibility due to employment of the resin film or the laminate according to the present embodiment.

In the case of a display device 100 employing the laminate according to the present embodiment as one or more constituent members selected from an organic EL device 50, a touch sensor 70 and a front plate 90, the display device 100 as a whole can have excellent flexibility. That is, the display device 100 can be a flexible device. Also, the outer surface of the display device 100 can have a high surface hardness.

The apparatus to which the resin film or the laminate according to the present embodiment can be applied (flexible device) is not limited to the display device described above. For example, the resin film or the laminate can be employed also in a solar cell having a substrate on which a photoelectric conversion element is formed and a front plate disposed on the substrate surface. In this case, with the laminate according to the present embodiment employed as the substrate or the front plate of a solar cell, the solar cell as a whole can have excellent flexibility.

EXAMPLES

Hereinafter, the present invention will be described more specifically with reference to Examples and Comparative Examples, though the present invention is not limited to the following Examples.

Example 1

Into a polymerization tank that had been purged with nitrogen, a compound represented by formula (1), a compound represented by formula (2), a compound represented by formula (3), a catalyst, and solvents (γ-butyrolactone and dimethylacetamide) were introduced. The feed amounts were set to 75.0 g of the compound represented by formula (1), 36.5 g of the compound represented by formula (2), 76.4 g of the compound represented by formula (3), 1.5 g of the catalyst, 438.4 g of γ-butyrolactone, and 313.1 g of dimethylacetamide. The molar ratio between the compound represented by formula (2) and the compound represented by formula (3) was 3:7, and the molar ratio between the sum of the compound represented by formula (2) and the compound represented by formula (3) and the compound represented by formula (1) was 1.00:1.02.

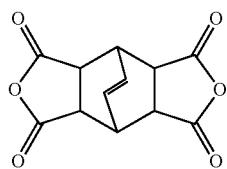
(1)

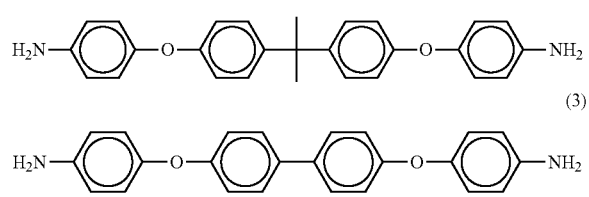
(2)

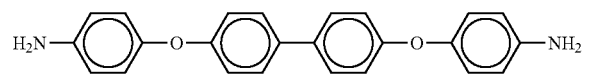
(3)

The mixture in the polymerization tank was stirred, and the raw materials were dissolved in the solvents. Subsequently, the mixture was heated to 100° C., and then heated to 200° C. The mixture was kept at the temperature for 4 hours, and thus a polyimide was produced by polymerization. During this heating, water in the liquid was removed. Subsequently, a polyimide (a polyimide-based polymer which contains repeating structural units represented by formula (PI)) was obtained through purification and drying.

Next, a γ-butyrolactone solution of the polyimide that had been adjusted to a concentration of 20 mass %, a dispersion liquid obtained by dispersing silica particles at a solid content concentration of 30 mass % in γ-butyrolactone, a dimethylacetamide solution of alkoxysilane having an amino group, and water were mixed, and the mixture was stirred for 30 minutes. The stirring was performed in accordance with the method described in U.S. Pat. No. 8,207,256 B2.

Here, the mass ratio between the silica particles and the polyimide was set to 60:40, the amount of the alkoxysilane having an amino group was set to 1.67 parts by mass with respect to 100 parts by mass of the sum of the silica particles and the polyimide, and the amount of water was set to 10 parts by mass with respect to 100 parts by mass of the sum of the silica particles and the polyimide.

The mixed solution was applied on a glass substrate and was heated at 50° C. for 30 minutes and at 140° C. for 10 minutes, for drying. Subsequently, a film was peeled off from the glass substrate, a metal frame was attached to the film, and the film was heated at 210° C. for one hour. Thus, a resin film having a thickness of 80 μm was obtained. The content of silica particles in the resin film was 60 mass %. The degree of yellowness (YI value) of the resin film obtained was 2.3.

Example 2

A resin film having a thickness of 80 μm was obtained in the same manner as in Example 1, except that the polyimide was changed to a polyimide having a glass transition temperature of 300° C. ("NEOPULIM" manufactured by Mitsubishi Gas Chemical Co., Inc., a polyimide-based polymer containing a repeating structural unit represented by formula (PI)), and the mass ratio between silica particles and polyimide in the mixed solution to form the resin film was changed to 30:70. The degree of yellowness (YI value) of the resin film obtained was 1.8.

Example 3

A resin film having a thickness of 75 μm was obtained in the same manner as in Example 1, except that the polyimide was changed to "KPI-MX300F (100), a polyimide-based polymer containing a repeating structural unit represented by formula (PI)" manufactured by Kawamura Sangyo Co., and the mass ratio between silica particles and polyimide in the mixed solution to form the resin film was changed to 20:80. The degree of yellowness (YI value) of the resin film obtained was 2.2.

Comparative Example 1

Using a polyimide having a glass transition temperature of 300° C. ("NEOPULIM" manufactured by Mitsubishi Gas Chemical Co., Inc., a polyimide-based polymer containing a repeating structural unit represented by formula (PI)), a γ-butyrolactone solution in which the polyimide only is dissolved was applied to a glass substrate. Apart from that, a resin film having a thickness of 80 μm was obtained in the same manner as in Example 1. The degree of yellowness (YI value) of the resin film obtained was 1.8.

Comparative Example 2

A resin film having a thickness of 80 μm was obtained in the same manner as in Comparative Example 1, except that the polyimide was changed to a polyimide having a glass transition temperature of 390° C. ("NEOPULIM" manufactured by Mitsubishi Gas Chemical Co., Inc., a polyimide-based polymer containing a repeating structural unit represented by formula (PI)). The degree of yellowness (YI value) of the resin film obtained was 1.4.

Comparative Example 3

A resin film having a thickness of 80 μm was obtained in the same manner as in Example 1, except that no alkoxysilane having an amino group was added to the mixed solution to form a resin film. The degree of yellowness (YI value) of the resin film obtained was 2.5.

Comparative Example 4

A resin film having a thickness of 80 μm was obtained in the same manner as in Example 1, except that the polyimide was changed to a polyimide having a glass transition temperature of 300° C. ("NEOPULIM" manufactured by Mitsubishi Gas Chemical Co., Inc., a polyimide-based polymer containing a repeating structural unit represented by formula (PI)), the mass ratio between silica particles and polyimide in the mixed solution to form the resin film was changed to 40:60, and no alkoxysilane having an amino group was added to the mixed solution. The degree of yellowness (YI value) of the resin film obtained was 2.2.

Evaluation
1) Elastic Modulus

As the measurement device of elastic modulus, AUTOGRAPH AG-IS, manufactured by Shimadzu Corporation, was used. A resin film in a strip form with a width of 10 mm and a length of 100 mm was prepared as test piece. A tension test was performed under conditions at a distance between chucks of 50 mm, and a velocity of 20 mm/min, so that the tensile elastic modulus of the resin film was measured.

2) Glass Transition Temperature (Tg)

As the measurement device, DSC Q200, manufactured by TA Instruments was used. Under the conditions of sample amount: 5 mg, temperature range: room temperature to 400° C., and temperature elevation rate: 10° C./min, the resin film was subjected to differential scanning calorimetry (DSC). From the DSC curve obtained, the glass transition temperature was determined.

3) Degree of Yellowness (YI Value)

The degrees of yellowness (Yellow Index: YI value) of a resin film was measured by an ultraviolet/visible/near-infrared spectrophotometer, V-670, manufactured by JASCO Corp. Background measurement was performed in a state without any sample, subsequently a resin film was placed on a sample holder, and measurement of transmittance for light at 300 nm to 800 nm was performed. Thus, tristimulus values (X, Y, Z) were determined. The YI value was calculated based on the following equation.

$$YI = 100 \times (1.2769X - 1.0592Z)/Y$$

4) Bending Test

Figure 6:
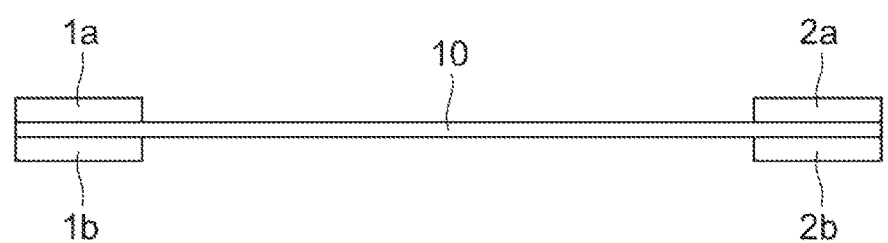
FIG. 6 is a schematic view showing a bending test method.
Figure 6:
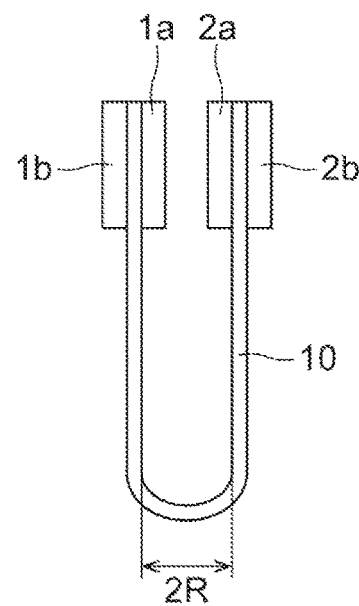

FIG. 6 is a schematic view showing the bending test method. As the test device, a table-top endurance test machine "DLDMLH-FS" manufactured by Yuasa System Co., Ltd., was used. The bending test shown in FIG. 6 is also referred to as U-shaped expansion and contraction test of a sheet without load. As shown in FIG. 6 (a), both ends of a resin film 10 in a strip sheet form (width: 10 mm, length: 100 mm) were inserted between a pair of plates 1a and 1b opposed to each other and between another pair of plates 2a and 2b opposed to each other, respectively, so as to be fixed. The plate 1a and the plate 2a were disposed on the same face-side of the resin film 10. Subsequently, as shown in FIG. 6 (b), the resin film was folded into a U-shape, such that the plate 1a and the plate 2a were opposed to each other at the inside. On this occasion, the distance 2R between the opposed faces of the folded resin film 10 was set at 3 mm. The folded resin film 10 was then unfolded to the state shown in FIG. 6 (a). The movements composed one cycle. The resin film 10 was repeatedly folded (bent) at a period rate of 1 cycle/1.2 sec. The test was continued until the number of bending (the number of cycles) reached 100000. In the case that a laminate fractured before completion of the test, the number of bending at the time was recorded.

5) Pencil Hardness (Resin Film)

The pencil hardness of the resin film fixed on a glass substrate was measured in accordance with JIS K5600-5-4. The load in the measurement of pencil hardness was set at 1 kg.

6) Pencil Hardness (Adhesive Layer/Resin Film/Hard Coat Layer)

On one principal face of a resin film, a hard coat layer having a thickness of 5 to 6 μm was formed with a hard coat agent (UVHC 7800G (trade name), manufactured by Momentive Inc.) under curing conditions including heating at 80° C. for 3 minutes and exposure to an irradiation energy of 500 mJ/cm², so that a laminate comprising the resin film and the hard coat layer (functional layer) was fablicated.

On a glass substrate, an adhesive layer having a thickness of 25 μm and an elastic modulus of about 1 MPa was formed by using acrylic-based adhesive. The laminate was adhered to the adhesive layer such that the resin film faced the adhesive layer. In this state, the pencil hardness of the hard coat layer surface was measured in accordance with JIS K5600-5-4. The load in the measurement of the pencil hardness was set to 1 kgf.

TABLE 1

| | Elastic modulus [GPa] | Number of bending times | Pencil hardness (resin film) | Pencil hardness (adhesive layer/resin film/hard coat layer) |
|---|---|---|---|---|
| Ex. 1 | 5.4 | More than 100000 times | <6B | B |
| Ex. 2 | 4.2 | More than 100000 times | <6B | B |
| Ex. 3 | 4.2 | More than 100000 times | <6B | B |
| Comp. Ex. 1 | 1.8 | More than 100000 times | <6B | 5B |
| Comp. Ex. 2 | 3.8 | Less than 30000 times | <6B | 4B |
| Comp. Ex. 3 | 5.6 | Less than 1000 times | <6B | <6B |
| Comp. Ex. 4 | 4.5 | Less than 20000 times | <6B | 4B |

In Table 1, the evaluation results are shown. The resin film in Examples had a tensile elastic modulus of 4 GPa or more, and caused no fracture until 100000 times of bending in the bending test. On the other hand, although the resin film in Comparative Example 1 caused no fracture in 100000 times of bending, the tensile elastic modulus thereof was less than 4.0 GPa.

The resin film in Comparative Example 2 had an elastic modulus of less than 4.0 GPa, and fractured in less than 30000 times of bending. The resin film in Comparative Example 3 had an elastic modulus of 4.0 GPa or more, but fractured in less than 1000 times of bending. The resin film in Comparative Example 4 had an elastic modulus of 4.0 GPa or more, but fractured in less than 20000 times of bending. No difference was found in the pencil hardness of the resin film surface of the laminate of glass substrate/resin film among Examples and Comparative Examples 1, 2, 3 and 4. A sufficiently high pencil hardness of the hard coat layer surface of the laminate of adhesive layer/resin film/ hard coat layer, however, was exhibited, only in the case of the resin films in Examples. From the results, it was confirmed that a resin film satisfying both of a tensile elastic modulus of 4 GPa or more and a number of more than 100000 times of bending can impart a sufficient hardness to the hard coat layer surface of the laminate of adhesive layer/resin film/hard coat layer.

REFERENCE SIGNS LIST

10: RESIN FILM, 20, 21: FUNCTIONAL LAYER, 25: PRIMER LAYER, 30: LAMINATE, 50: ORGANIC EL DEVICE, 70: TOUCH SENSOR, 90: FRONT PLATE, 100: DISPLAY DEVICE

The invention claimed is:

1. A resin film comprising a polyimide-based polymer, wherein the resin film has a tensile elastic modulus of 4.0 GPa or more;

in a bending test where the resin film is repeatedly folded into a U-shape until the distance between the resin film faces opposed to each other reaches 3 mm, and unfolded, the number of times of folding the resin film until the resin film fractures is more than 100000; and the resin film has a degree of yellowness of 5 or less.

2. The resin film according to claim 1, wherein the resin film has a thickness of 30 to 100 μm.

3. An optical member comprising the resin film according to claim 1.

4. A gas barrier material comprising the resin film according to claim 1.

5. A laminate comprising the resin film according to claim 1 and a functional layer disposed on at least one face side of the resin film.

6. The laminate according to claim 5, further comprising a primer layer disposed between the resin film and the functional layer.

7. The laminate according to claim 5 or 6, wherein
the functional layer is disposed on both face sides of the resin film, wherein
the functional layer on one face side is a layer for enhancing the surface hardness, and the functional layer on another face side is a layer having a function of adhesiveness.

8. An optical member comprising the laminate according to claim 5.

9. A gas barrier material comprising the laminate according to claim 5.

10. A touch sensor substrate comprising the laminate according to claim 5.

11. A touch sensor substrate comprising the resin film according to claim 1.

* * * * *